United States Patent
Lai et al.

(10) Patent No.: US 6,849,526 B2
(45) Date of Patent: Feb. 1, 2005

(54) METHOD OF IMPROVING DEVICE RESISTANCE

(75) Inventors: Jiun-Ren Lai, Pingtung (TW); Chun-Yi Yang, Hsinchu (TW); Shi-Xian Chen, Hsinchu (TW); Gwen Chang, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/708,210

(22) Filed: Feb. 17, 2004

(65) Prior Publication Data

US 2004/0161896 A1 Aug. 19, 2004

Related U.S. Application Data

(62) Division of application No. 10/065,351, filed on Oct. 8, 2002, now Pat. No. 6,720,629.
(60) Provisional application No. 60/319,376, filed on Jul. 3, 2002.

(51) Int. Cl.[7] ............................................. H01L 21/425
(52) U.S. Cl. ..................... 438/527; 438/308; 438/369; 438/373; 438/473; 438/506; 438/480; 438/510; 438/519; 438/526; 257/390

(58) Field of Search .................................. 438/202, 917, 438/301–308, 368–373, 473, 480, 510–515, 518–527; 257/390, 610

(56) References Cited

U.S. PATENT DOCUMENTS

| | | | | |
|---|---|---|---|---|
| 6,037,227 A | * | 3/2000 | Hong | 438/276 |
| 6,091,644 A | * | 7/2000 | Hsu et al. | 365/185.33 |
| 6,168,993 B1 | * | 1/2001 | Foote et al. | 438/262 |
| 6,188,614 B1 | * | 2/2001 | Hsu et al. | 365/185.33 |
| 6,214,668 B1 | * | 4/2001 | Hsu et al. | 438/257 |
| 6,440,875 B1 | * | 8/2002 | Chan et al. | 438/778 |
| 2002/0113272 A1 | * | 8/2002 | Hsu et al. | 257/371 |
| 2003/0013282 A1 | * | 1/2003 | Hsieh et al. | 438/514 |
| 2003/0104670 A1 | * | 6/2003 | Wu | 438/257 |

* cited by examiner

*Primary Examiner*—Matthew Smith
*Assistant Examiner*—Granvill D. Lee, Jr.
(74) *Attorney, Agent, or Firm*—Jiang Chyun IP Office

(57) ABSTRACT

A buried bit line and a fabrication method thereof, wherein the device includes a substrate, a shallow doped region disposed in the substrate, a deep doped region disposed in the substrate below a part of the shallow doped region, wherein the shallow doped region and the deep dope region together form a bit line of the memory device.

19 Claims, 5 Drawing Sheets

METHOD OF IMPROVING DEVICE RESISTANCE

CROSS REFERENCE TO RELATED APPLICATIONS

This application is a divisional application of, and claims the priority benefit of, U.S. application Ser. No. 10/065,351 filed Oct. 08, 2002, U.S. Pat. No. 6,720, 629 which claims the priority benefit of U.S. provisional application Ser. No. 60/319,376, filed on Jul. 03, 2002.

BACKGROUND OF INVENTION

1. Field of the Invention

The present invention relates to a structure of a memory device and a fabrication method thereof. More particularly, the present invention relates to a structure of buried bit line of a memory device and a fabrication method thereof.

2. Description of Related Art

Memory device, by nature, is a semiconductor device used to store information and data. The storage of digital information is in unit of bit. Information is stored in a cell in the memory device. The specific location of each memory cell is known as an address. In other words, the memory cells in a memory device are arranged in an array, wherein a specific row and column constitutes a specified memory cell address. The memory cells on each row or each column are connected with a common conductive line.

Referring to FIG. 1, FIG. 1 is a schematic, cross-sectional view of a structure of a memory cell device according to the prior art.

Referring to FIG. 1, a conventional memory device comprises a substrate 10, a buried bit line 12, a gate oxide layer 16, an insulation structure 14 and a word line 18. The buried bit line 12 is disposed in the substrate, while the word line 18 extends above and across the buried bit line 12. Further, the gate oxide layer 16 is disposed on a surface of the substrate 10 to electrically isolate the word line 18 and the substrate 10. The insulation structure 14 is disposed above the buried bit line 12 to electrically isolate the word line 18 and the buried bit line 14.

Accompanying the increase of circuit integration and the miniaturization of device dimension, the linewidth of the buried drain region is also being scaled down. A narrower linewidth, however, would lead to its resistance to increase. Consequently, the current flow of the memory device is reduced and bit line loading would become too high. If the junction depth of the buried drain region is increased to resolve the problem of raised resistance at the linewidth, not only is the short channel effect generated, the problem of junction leakage also occurs. If a high concentration of dopants is used to form a shallow junction of the bit line to obviate the short channel effect and the junction leakage problem due to a deep junction, the overloading problem of the bit line remains unresolved because of the limitation of the solid-phase solubility. Further, in a conventional memory device, a bit line contact is required for every 32 bit lines or 64 bit lines to control the memory device. The formation of a bit line contact, however, is limited by the integration of the device. Lower the number of the bit line contact in order to increase the integration of the device is thus very important.

SUMMARY OF INVENTION

Accordingly, the present invention provides a structure of a buried bit line of a memory device and a fabrication method thereof, wherein the bit line resistance is reduced.

The present invention also provides a structure of a buried bit line of a memory device and a fabrication method thereof, wherein the generation of the short channel effect and the junction leakage problem are prevented.

The present invention further provides a structure of a memory device and a fabrication method thereof, wherein the number of the bit line contacts in the device is reduced to increase the integration of the device.

In accordance to the present invention, a structure of a memory device is provided, the structure comprises a substrate, a deep doped region and a shallow doped region. The shallow doped region is disposed in the substrate while the deep doped region is disposed in the substrate under a part of the shallow doped region. The shallow doped region and the deep doped region together serve as a buried bit line of the memory device. In the present invention, the dopant concentrations in the deep doped region and in the shallow doped region are about the same. The dopant concentrations in the shallow doped region and the deep doped region are about $10^{21}/cm^3$ to $10^{22}/cm^3$.

The present invention provides a fabrication method for a memory device. This method comprises forming a patterned mask layer on a substrate, wherein this mask layer is a photoresist layer, a polysilicon layer or a dielectric layer (for example, silicon nitride or silicon oxide type of dielectric material). Thereafter, using the mask layer as an ion implantation mask, a first ion implantation process is performed to form a shallow doped region in the substrate not covered by the mask layer. A linear layer is then formed on the surface of the mask layer, wherein the liner layer is formed by, for example, plasma enhanced chemical vapor deposition and the liner layer is, for example, a polymer liner layer. A point that is worth noting is that if the liner layer formed on the surface of the mask layer is a polymer layer, the liner layer can be reworked even deviation occurs in the critical dimension of the liner layer. A second ion implantation process is performed to form a deep doped region in the substrate not covered by the liner layer and the mask layer, using the liner layer and the mask layer as an implantation mask, wherein the shallow doped region and the deep doped region together form a bit line of a memory device. The mask layer and the liner layer are then removed, followed by forming a gate oxide layer on the surface of the substrate and a gate on the gate oxide layer.

The present invention provides a memory device, the device comprises a substrate, a gate, a gate oxide layer, a deep doped region and a shallow doped region. The gate is disposed on a part of the substrate while the gate oxide layer is disposed between the substrate and the gate. The shallow doped region is disposed in the substrate beside both sides of the gate while the deep doped region is disposed in the substrate under a part of the shallow doped region. The shallow doped region and the deep doped region together serve as a buried bit line of a memory device. In this aspect of the present invention, the dopant concentrations in both the deep doped region and the shallow doped region are about $10^{21}/cm^3$ to $10^{22}/cm^3$.

The present invention provides a fabrication method for a memory device. This method comprises forming a patterned mask layer on a substrate, wherein this mask layer is a photoresist layer, a polysilicon layer or a dielectric layer (for example, silicon nitride or silicon oxide type of dielectric material). Thereafter, using the mask layer as an ion implantation mask, a first ion implantation process is performed to form a shallow doped region in the substrate not covered by the mask layer. A linear layer is then formed on the surface of the mask layer, wherein the liner layer is formed by, for example, plasma enhanced chemical vapor deposition and the liner layer is, for example, a high molecular weight liner layer. A point that is worth noting is that if the liner layer formed on the surface of the mask layer is a high molecular material layer, the liner layer can be reworked even deviation occurs in the critical dimension of the liner layer. A second ion implantation process is performed to form a deep doped region in the substrate not covered by the liner layer and the mask layer, using the liner layer and the mask layer as an implantation mask, wherein the shallow doped region and the deep doped region together form a bit line of a memory device. The mask layer and the liner layer are then removed, followed by forming a gate oxide layer on the surface of the substrate and a gate on the gate oxide layer.

Accordingly, the buried bit line is formed with the shallow doped region and the deep doped region, the resistance of the bit line of the memory device is thus lowered.

The junction of the shallow doped region of the buried bit line of the present invention can be made shallower. The problems of the short channel effect and leakage current are prevented to raise the reliability of the device. Moreover, the resistance created in the shallow doped region is also being compensated. Therefore, forming a narrower deep doped region under shallow doped region, the resistance of the entire buried bit line is lower.

In accordance to the memory device of the present invention and the fabrication method thereof, since the resistance of the bit line is effectively lowered, the voltage of the bit line can be lowered to reduce the number of the bit line contacts in the device to increase the integration of the device.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

In this aspect of the invention, the fabrication methods and the structures of a mask ROM device and a silicon nitride memory device are used illustrate the features of the invention. However, it should be appreciated that the teaching of the present invention is not limited to a mask ROM device or a silicon nitride memory device.

FIGS. 2A to 2F are schematic cross-sectional views illustrating the process flow for manufacturing of a memory device according to one aspect of the present invention.

Figure 1:
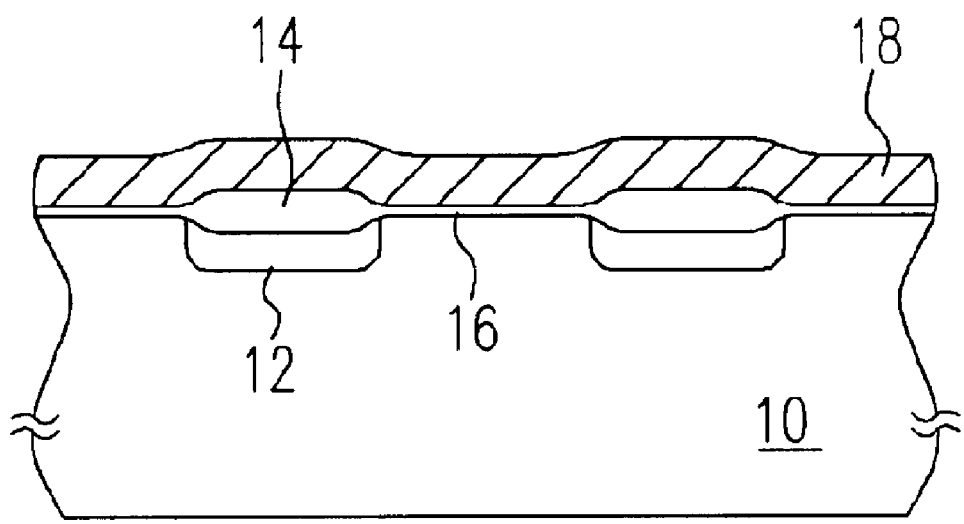
FIG. 1 is a schematic, cross-sectional view of a memory device according to the prior art.
Figure 2A:
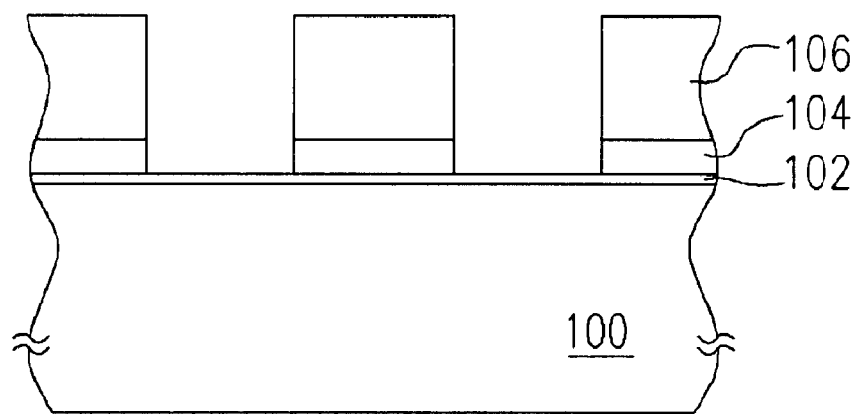
FIGS. 2A to 2F are schematic, cross-sectional views illustrating the process flow for manufacturing of a memory device according to one aspect of the present invention.

Referring to FIG. 2A, a pad oxide layer 102 is formed on a substrate 100 to protect the surface of the substrate 100. A patterned mask layer 106 is further formed on the pad oxide layer 102, wherein the mask layer 106 can be a photoresist layer, a polysilicon layer, or a dielectric material layer (for example, silicon nitride or silicon oxide type of dielectric material). In this aspect of the present invention, if the mask layer 106 is a photoresist material, an anti-reflection layer 104 is further formed at the bottom of the photoresist material mask layer 106.

Figure 2B:
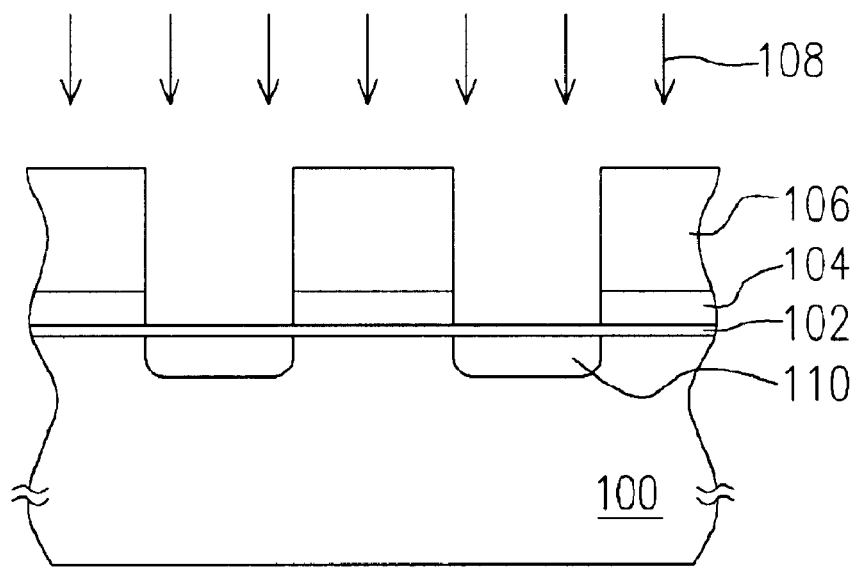

Referring to FIG. 2B, using the mask layer 106 as an implantation mask, an ion implantation process 108 is performed to form a shallow doped region 110 in the part of the substrate 100 that is not covered by the mask layer 106. According to this aspect of the present invention, the implantation energy for the ion implantation process 108 is about 40 KeV to 80 KeV and the dopant concentration in the buried bit line is about $10^{21}/cm^3$ to $10^{22}/cm^3$.

Figure 2C:
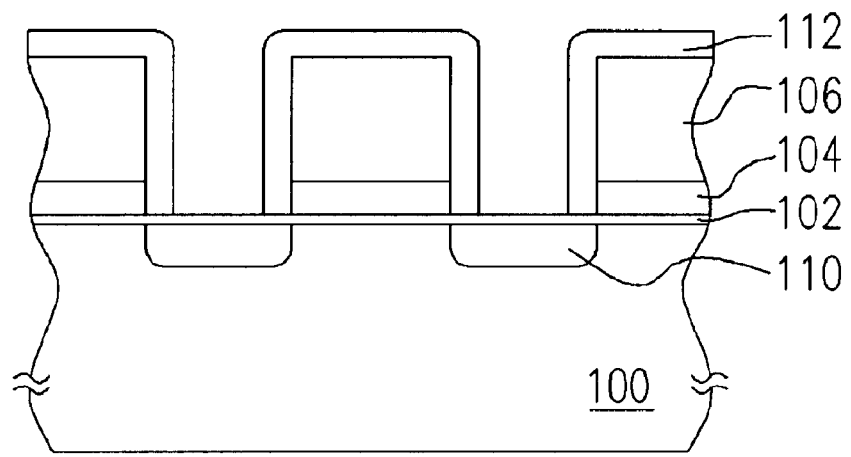

Referring to FIG. 2C, a liner layer 112 with a predetermined thickness is formed on the surface of the mask layer 106, wherein the liner layer 112 is formed by, for example, plasma enhanced chemical vapor deposition. A material for the liner layer 112 is, for example, a polymer material. A point that is worth noting is that if the liner layer 112 is a polymer layer, the liner layer 112 can be reworked directly even deviation occurs in the critical dimension of the liner layer.

In accordance to this aspect of the present invention, a major component in one type of the reaction gas used for the plasma enhanced chemical vapor deposition in forming the liner layer 112 is, for example, $CH_2F_2$, a mixture gas of $CH_2F_2$ and $C_4F_8$ or a mixture gas of $CH_2 2F_2$ and $CHF_3$. Further, the plasma enhanced chemical vapor deposition is conducted under a pressure of, for example, 1 to 100 mTorr with a power of about 500 to 2000 W. Further, the self bias value of the plasma enhanced chemical vapor deposition is between, for example, 0 to 400 volts and the deposition rate is between, for example, 600 to 6000 angtroms/minutes. Further, the reaction gas for the plasma enhanced chemical vapor deposition can also incorporate an argon gas, a carbon monoxide gas, an oxygen gas and a nitrogen gas, etc. therein.

Figure 2D:
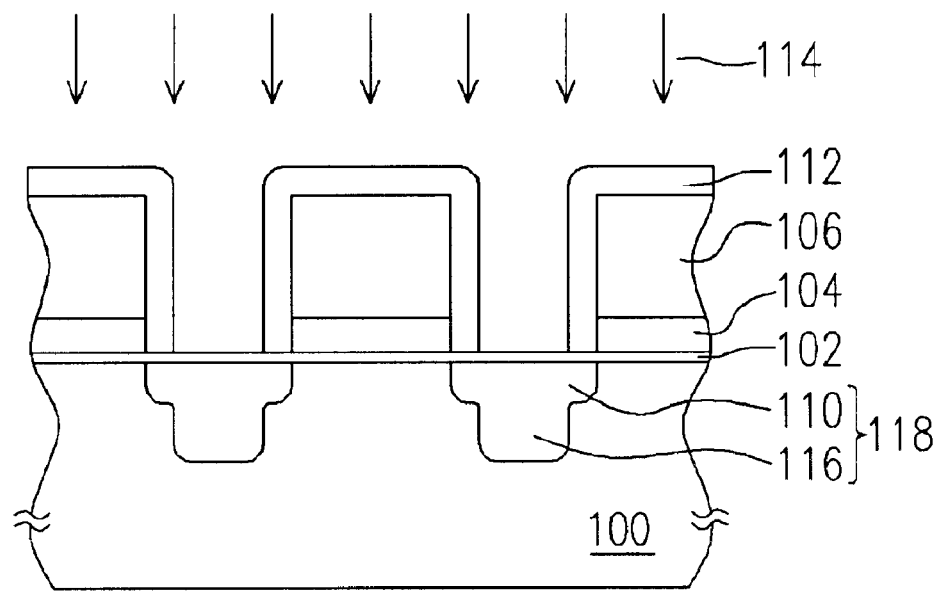

Thereafter, as shown in FIG. 2D, using the liner layer 112 and a mask layer 106 as an implantation mask, an ion implantation 114 is performed to form a deep doped region 116 in the substrate 100 not covered by the liner layer 112 and the mask layer 106. The deep doped region 116 is formed under a part of the shallow doped region 110, wherein the deep doped region 116 and the shallow doped region 110 together serve as the buried bit line 118 of the memory device. Further, the dopant concentrations in both the deep doped region 116 and the shallow doped region 110 are about the same. In this aspect of the present invention, the implantation energy for the ion implantation process 114 is about 50 to 120 KeV and the dopant concentration in the deep doped region 116 is about $10^{21}/cm^3$ to $10^{22}/cm^3$.

Subsequent to the formation of the shallow doped region 110 and the deep doped region 116, the present invention further includes performing an annealing process on the buried bit line 118, in which comprises of the shallow doped region 110 and the deep doped region 116. The annealing process includes, for example, a rapid thermal process or a laser thermal process.

A point that is worth noting is that the buried bit line 118 of the present invention is formed by the shallow doped region 110 and the deep doped region 116 under a part of the shallow doped region 110. Therefore, the method of the present invention in forming a memory device can lower the resistance of the bit line 110 to attenuate the problem of a raised resistance due to the scaling down of the memory device. Furthermore, the junction of the shallow doped region 110 of the buried bit line can be made shallower to prevent the short channel effect and the junction leakage problem in order to raise the reliability of the device. Further, the resistance created by the shallow doped region 110 is also compensated. Therefore, a narrower deep doped region 116 formed under the shallow doped region 110 can lower the resistance of the entire buried bit line 118.

Figure 2E:
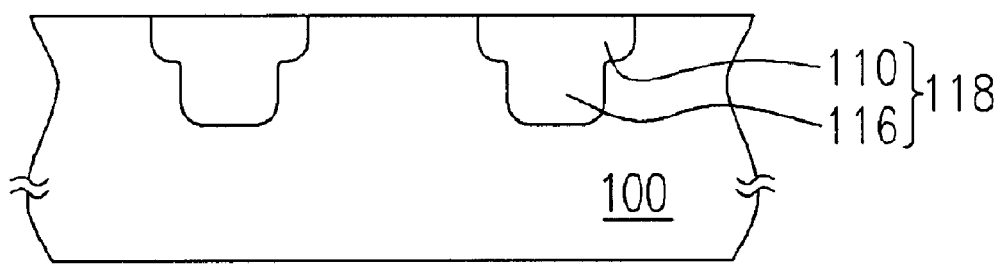

Continuing to FIG. 2E, the liner layer 112 and the mask layer 106 are removed. If the mask layer 106 is a photoresist material and the liner layer 112 is a polymer material, the photoresist material mask layer 106 (including anti-reflection layer 104) and the liner layer 112 can be removed concurrently. After this, the pad oxide layer 102 is removed to expose the surface of the substrate 100.

Figure 2F:
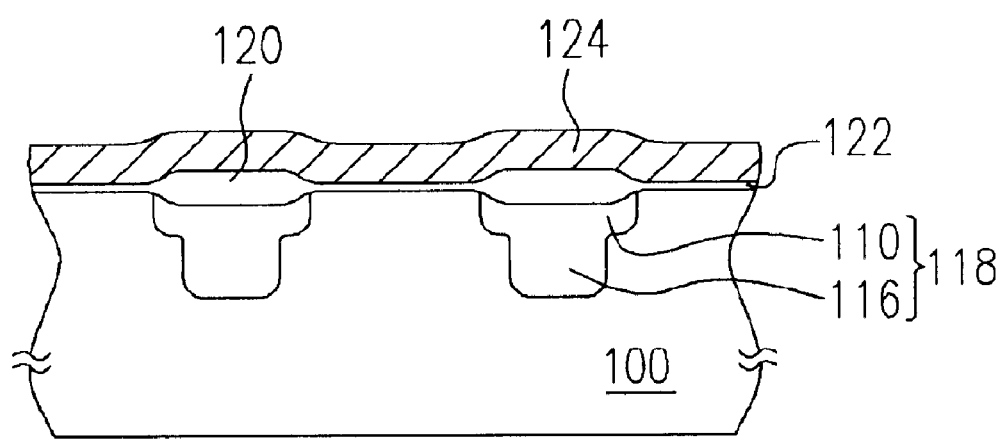

Referring to FIG. 2F, an insulation structure 120 is formed above the shallow doped region 110. A gate oxide layer 122 is further formed on the surface of the substrate 100. A patterned hard mask layer (not shown) is formed, for example, on the substrate 100 between the insulation structure 120 and the gate oxide layer 122 and exposing the shallow doped region 110. A thermal oxidation process is then performed to form a field oxide insulation layer on the shallow doped region 110. The hard mask layer is subsequently removed, followed by performing another thermal oxidation process to form a gate oxide layer 122 on an exposed surface of the substrate 100.

Subsequently, a word line 124 is formed above the substrate 100, covering the insulation structure 120 and the gate oxide layer 122 to complete the fabrication of the mask ROM device.

The memory device of the present invention further comprises a substrate 100, a shallow doped region 110, a deep doped region 116, an insulation structure 120, a gate oxide layer 122 and a word line 124, wherein the shallow doped region 110 is located in the substrate 100, while the deep doped region 116 is disposed in the substrate 100 under a part of the shallow doped region 110. The shallow doped region 110 and the deep doped region 116 together serve as the bit line 118 of the memory device. In the present invention, the dopant concentrations in both the deep doped region 116 and the shallow doped region 110 are about the same. Further, the insulation structure 120 is disposed above the shallow doped region 110. The gate oxide layer 122 is disposed on the surface of the substrate 100. The word line 124 is disposed across the buried bit line 118, covering the insulation structure 120 and the gate oxide layer 122.

The bit line design for a memory device of the present invention is also applicable to a silicon nitride memory device as discussed in the following.

Figure 3:
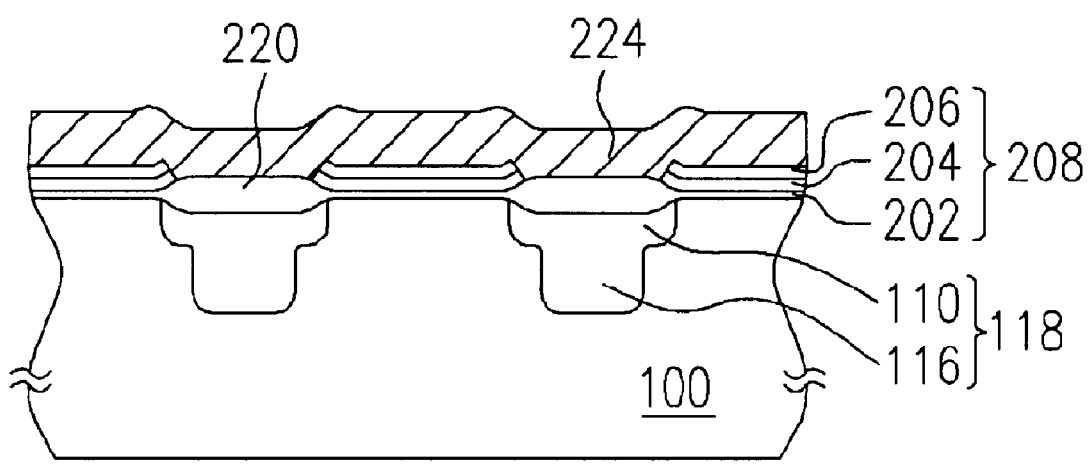
FIG. 3 is a schematic, cross-sectional view of a silicon nitride memory device according to another aspect of the present invention.

The aforementioned processing steps are performed, in which a bit line 118 (formed by a shallow doped region 110 and a deep doped region 116) is formed in a substrate 100 as shown in FIG. 2E. Then, referring to FIG. 3, an electron trapping layer 208 is formed on the substrate 100. The electron trapping layer 208 is formed by stacking a first silicon oxide layer 202, a silicon nitride layer 204 and a second silicon oxide layer 206. The electron trapping layer 208 covers the substrate 100 surface beside both sides of the bit line 118.

Thereafter, an insulation structure 220 is formed above the shallow doped region 110. Thereafter, a word line 224 is formed above the substrate 100 to complete the fabrication of a silicon nitride memory device.

The silicon nitride memory device of the present invention comprises a substrate 100, a shallow doped region 110, a deep doped region 116, an insulation structure 220, an electron trapping layer 208 and a word line 224, wherein the shallow doped region 110 is disposed in the substrate 100 while the deep doped region 116 is disposed in the substrate 100 under a part of the shallow doped region 110. Moreover, the shallow doped region 110 and the deep doped region 116 together form the buried bit line 118 of the memory device. In this present invention, the dopant concentrations in the deep doped region and the shallow doped region 110 are about the same. Further, the insulation structure 220 is disposed above the shallow doped region 110. The electron trapping layer 208 is disposed on the surface of the substrate 200 beside both sides of the insulation structure 220. In the present invention, the electron trapping layer 208 is formed by stacking a first silicon oxide layer 202, a silicon nitride layer 204 and a second silicon oxide layer. The word line 224 is disposed above the substrate and across the buried bit line 118, covering the insulation structure 220 and the electron trapping layer 208.

Since the buried bit line of the present invention is formed with a shallow doped region and a deep doped region, the resistance of the buried bit line of the memory device is effectively lowered.

Further, the shallow doped region junction of the buried bit line can be shallower to prevent the short channel effect and the junction leakage problem to increase the reliability of the device. The resistance created by the shallow doped region is also being compensated. Therefore, a narrower deep doped region is formed under the shallow doped region to lower the resistance of the entire buried bit line.

Further, in accordance to the structure of a memory device and the fabrication method thereof of the present invention, since the resistance of the buried bit line is effectively lower, the voltage of the buried bit line is also lower to reduce the number of the bit line contacts in the device in order to raise the integration of the device.

Although in the above embodiments, the present invention has been described with respect to a mask ROM memory device and a silicon nitride device, the buried bit line of the present invention is also applicable to other memory devices, such as, a flash memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a buried bit line, comprising:
   forming a patterned mask layer on a substrate;
   forming a shallow doped region in the substrate not covered by the mask layer;
   forming a liner layer with a predetermined thickness on at least a side surface of the mask layer; and
   forming a deep doped region in the substrate not covered by the liner layer and the mask layer, wherein the shallow doped region and the deep doped region together serve as a buried bit line.

2. The method of claim 1, wherein the patterned mask layer is formed with a photoresist material, polysilicon or a dielectric material.

3. The method of claim 1, wherein the liner layer is formed with a polymer material.

4. The method of claim 3, wherein liner layer is reworked directly when deviations occur in a critical dimension after the liner layer is formed.

5. The method of claim 3, wherein the liner layer is formed by plasma enhanced chemical vapor deposition.

6. The method of claim 1, wherein the deep doped region is formed with an implantation energy of about 50 KeV to 120 KeV.

7. The method of claim 1, wherein the shallow doped region is formed with an implantation energy of about 40 KeV to 80 KeV.

8. A method of fabricating a memory device, comprises:

forming a patterned mask layer on the substrate;

performing a first ion implantation using the patterned mask layer as mask to form a plurality of shallow doped regions in the substrate exposed by the patterned mask layer; forming a liner layer with predetermined thickness on at least a side surface of the mask layer;

performing a second ion implantation using the patterned mask layer and the liner layer as mask to form a plurality of deep doped regions in the substrate under a part of the shallow doped regions, wherein the dopant concentrations in the shallow doped regions and the deep doped regions are about the same;

removing the patterned mask layer and the liner layer;

forming a plurality of insulation structures on the shallow doped regions;

forming a plurality of gate oxide layers on the substrate; and forming a plurality of word lines covering a part of the insulation structures and gate oxide layers over the substrate.

9. The method of claim 8, the patterned mask layer is formed with a photoresist material, polysilicon, or a dielectric material.

10. The method of claim 8, wherein the liner layer comprises a polymer layer formed by plasma enhanced chemical vapor deposition.

11. The method of claim 8, wherein the deep doped regions are formed with an implantation energy of about 50 KeV to 120 KeV and the shallow doped regions are formed with an implantation energy of about 40 KeV to 80 KeV.

12. The method of claim 8, wherein a dopant concentration in the deep doped regions and the dopant concentration in the shallow doped region are about $10^{21}/cm^3$ to $10^{22}/cm^3$.

13. The method of claim 8, wherein the insulation structures is formed by a thermal oxidation process using a patterned hard mask layer.

14. A method of fabricating a silicon nitride memory device, comprises:

forming a patterned mask layer on the substrate;

performing a first ion implantation using the patterned mask layer as mask to form a plurality of shallow doped regions in the substrate exposed by the patterned mask layer;

forming a liner layer with predetermined thickness on at least a side surface of the mask layer;

performing a second ion implantation using the patterned mask layer and the liner layer as mask to form a plurality of deep doped regions in the substrate under a part of the shallow doped regions, wherein the dopant concentrations in the shallow doped regions and the deep doped regions are about the same;

removing the patterned mask layer and the liner layer;

forming a plurality of insulation structures on the shallow doped regions;

forming a electron trapping layer containing a silicon nitride layer on the substrate; and forming a plurality of word lines on the substrate.

15. The method of claim 14, wherein the mask layer is formed with a photoresist material, polysilicon, or a dielectric material.

16. The method of claim 15, wherein the insulation structures is formed by a thermal oxidation process using a patterned hard mask layer.

17. The method of claim 14, wherein the liner layer comprises a polymer layer formed by plasma enhanced chemical vapor deposition.

18. The method of claim 14, wherein the deep doped regions are formed with an implantation energy of about 50 KeV to 120 KeV and the shallow doped regions are formed with an implantation energy of about 40 KeV to 80 KeV.

19. The method of claim 14, wherein a dopant concentration in the deep doped regions and the dopant concentration in the shallow doped region are about $10^{21}/cm^3$ to $10^{22}/cm^3$.

* * * * *